(12) United States Patent
Koh

(10) Patent No.: US 7,217,620 B2
(45) Date of Patent: May 15, 2007

(54) METHODS OF FORMING SILICON QUANTUM DOTS AND METHODS OF FABRICATING SEMICONDUCTOR MEMORY DEVICE USING THE SAME

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 316 days.

(21) Appl. No.: 11/027,516

(22) Filed: Dec. 30, 2004

(65) Prior Publication Data

US 2005/0142753 A1  Jun. 30, 2005

(30) Foreign Application Priority Data

Dec. 31, 2003  (KR) .............. 10-2003-0101926

(51) Int. Cl.
*H01L 21/336* (2006.01)
(52) U.S. Cl. ............... 438/266; 438/962; 438/488
(58) Field of Classification Search ........... 438/266, 438/962, 488
See application file for complete search history.

(56) References Cited

U.S. PATENT DOCUMENTS 6,346,436 B1 * 2/2002 Fukushima et al. ......... 438/165
6,351,007 B1 * 2/2002 Fukushima et al. ......... 257/314

FOREIGN PATENT DOCUMENTS

KR  10-2000-057981  9/2000
KR  10-2001-104946  11/2001

* cited by examiner

*Primary Examiner*—Jack Chen
(74) *Attorney, Agent, or Firm*—Andrew D. Fortney

(57) ABSTRACT

The disclosure provides methods of forming a silicon quantum dots for application in a semiconductor memory device. One example method includes sequentially forming a pad oxide film and a sacrificial insulation film on a silicon substrate; forming a wall layer by selectively etching the sacrificial insulation film; forming a spacer at the side wall of the wall layer; etching the silicon substrate as much as a predetermined thickness using the spacer as a mask, thereby forming a silicon pattern; forming a barrier film for burying the upper surface and the side surface of the silicon pattern; applying isotropic etching to the substrate using the barrier film as a mask; and oxidizing the isotropic etched substrate with thermal treatment.

10 Claims, 4 Drawing Sheets

METHODS OF FORMING SILICON QUANTUM DOTS AND METHODS OF FABRICATING SEMICONDUCTOR MEMORY DEVICE USING THE SAME

TECHNICAL FIELD

The present invention relates to semiconductors and, more particularly, to methods of forming silicon quantum dots and methods of fabricating semiconductor memory devices using the same.

BACKGROUND

It can be foreseen that the use of a metal oxide semiconductor (MOS) structure as a basic switching device will reach its limit, as device packing density increases. In a case of the MOS structure with a device packing density beyond a 4 gigabyte (GB) dynamic random access memory (DRAM) range, a switching operation using a gate voltage in accordance with the principles of a MOS device operation will be impossible, because the distance between a source and a drain becomes too close. In other words, integration of the MOS structure is typically limited to about 4 gigabyte DRAM because malfunctions of the device may occur due to tunneling between the source and the drain and through a gate oxide film even when no gate voltage is applied. Therefore, to fabricate a device of gigabyte or terabyte class, a form of device other than the current MOS structure should be employed. The form of device suggested by many research groups is the single electron transistor (SET).

The SET is a device employing the so-called Coulomb blockade effect pertaining to quantum effects exhibited by the interaction between electrons having a nano-scale dimension, whereby any further tunneling of charges is suppressed during the process of tunneling charge carriers such as electrons or holes through an insulation film, such that the individual flow of discrete electrons can be controlled.

The principle of the Coulomb blockade effect caused by an SET tunneling is as follows. If the total capacitance caused by a region into which electrons enter through tunneling is very small, a charge effect of the discrete electrons can be observed. If a charge energy $e^2/2C$ of the discrete electron charge is greater than an energy kBT of a thermal vibration and there is no voltage increase applied externally when the temperature remains constant, an electron can not have the energy required for charging a capacitor by tunneling. Accordingly, no further tunneling occurs once one electron is charged. That is, once an electron previously tunneled and charged in a capacitor causes a low voltage having a level of at least a voltage drop at the capacitor is applied to the next electron, the next electron does not achieve the level of energy required for charging by tunneling, and thus no further tunneling occurs. This effect of suppression of further tunneling due to electrons that have already tunneled called a Coulomb blockade effect.

Generally, the SET structure using the Coulomb blockade effect has, like a MOS structure including a source, a drain, and a gate, with a channel having conductive quantum dots for facilitating a discrete electron flow. Therefore, the channel consists of an insulating material and the conductive quantum dots, facilitating electron flow by using discrete tunneling.

To fabricate a nano device using the quantum dots, technology enabling formation of the quantum dot with the crystal characteristics of a single crystal type and the technology for forming a delicate and uniform quantum dot are required.

The conventional technologies in forming the quantum dots are the method of using lithography, and the method of depositing $SiO_2$ while making a high ratio of silicon to form a silicon quantum dot.

DETAILED DESCRIPTION

Figure 1:
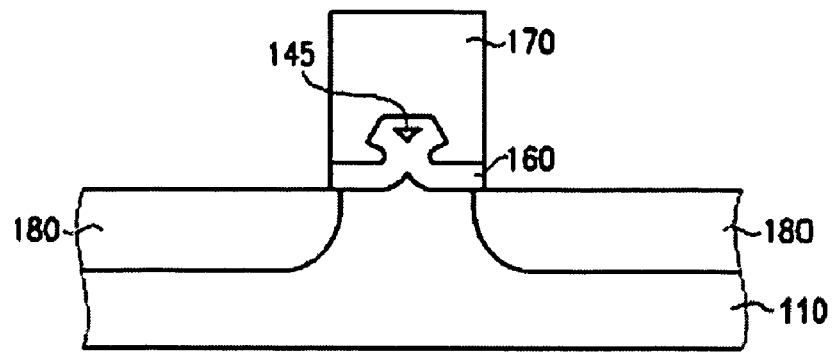
FIG. 1 is a sectional view briefly showing a disclosed semiconductor memory device.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

As shown in FIG. 1, a disclosed semiconductor memory device includes a gate insulation film 160 comprising a oxide film is formed at a certain region on an active region of a silicon substrate 100, and a single silicon quantum dot 145 comprising polysilicon is provided. A control gate 170 comprising a conductor for an electrode is formed on the gate insulation film 160.

At the silicon substrate 100 under the control gate 170, source/drain regions 180 are formed with the control gate 170 therebetween. The source/drain regions 180 are partially overlapped with the control gate 170.

The silicon pattern formed in the silicon substrate 100 is isolated in the gate insulation film 160 by the thermal oxidation process for forming the gate insulation film 160, thereby forming the silicon quantum dot 145. A nano scale semiconductor memory device can be formed by using such a silicon quantum dot.

Henceforth, a method for fabricating the semiconductor memory device shown in FIG. 1 according to a disclosed example will be described in detail with reference to FIGS. 2a to 2i and FIG. 1.

Figure 2A:
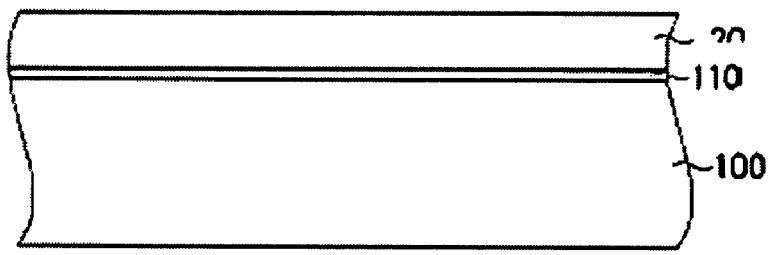
FIGS. 2A to 2I are sectional views of a semiconductor memory device at various stages of fabrication for explaining an example method disclosed herein.

As shown in FIG. 2A, a silicon substrate 100 in which an active region and an inactive region are divided is formed, and a pad oxide film 110 and sacrificial insulation film 120 are formed on an active region of the silicon substrate 100. The pad oxide film 110 serves for reducing the stress of the silicon substrate 100 and the sacrificial oxide film 120. The pad oxide film 110 is formed to have a thickness within the range of 100 Å to 200 Å, and the sacrificial insulation film 120 is formed to have a thickness within the range of 1000 Å to 2000 Å. The sacrificial insulation film 120 is preferably formed with a nitride series material.

Figure 2B:
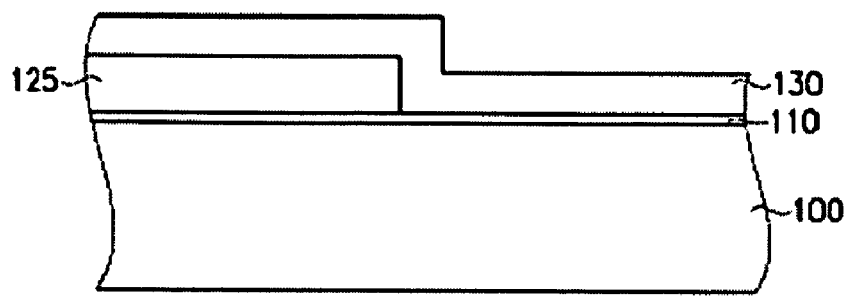

As shown in FIG. 2B, a wall layer 125 formed with the sacrificial insulation film is formed by selectively etching the sacrificial insulation film. The wall layer 125 is a pattern for forming a spacer, which is described below. An oxide film 130 is formed on the substrate 100, which includes the wall layer 125, in a predetermined thickness. Here, the oxide film is a film for forming a spacer which determines the size of a quantum dot. Therefore, it is preferable that the oxide film 130 is formed to have a thickness within the range of 500 Å to 2000 Å. However, the thickness may be adjusted according to the design rule or the process characteristics of the device.

Figure 2C:
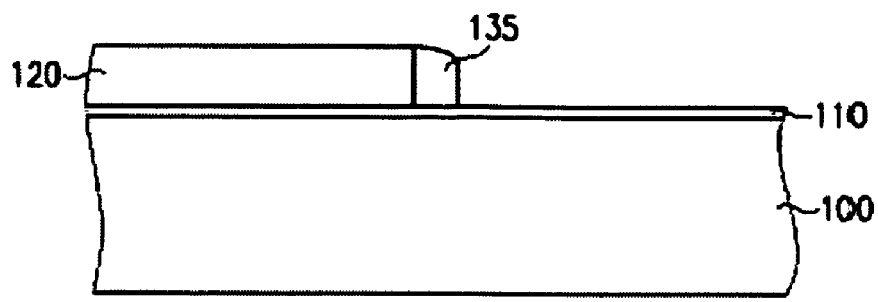
Figure 2D:
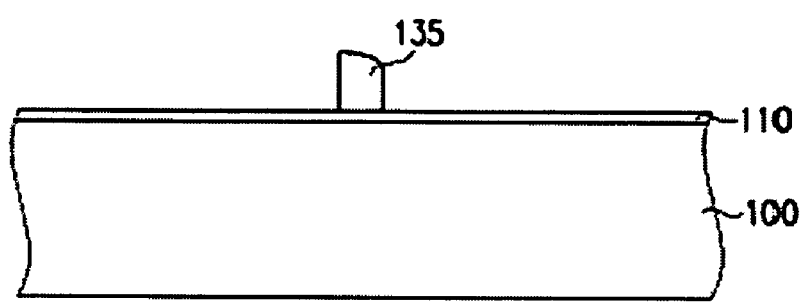

As shown in FIGS. 2C and 2D, a spacer 135 which determines the size of a quantum dot is formed at the side wall of the wall layer 125 by etching back the oxide film, and the wall layer 125 is removed. Here, the wall layer 125 is removed by using a phosphoric acid solution by wet etching.

Figure 2E:
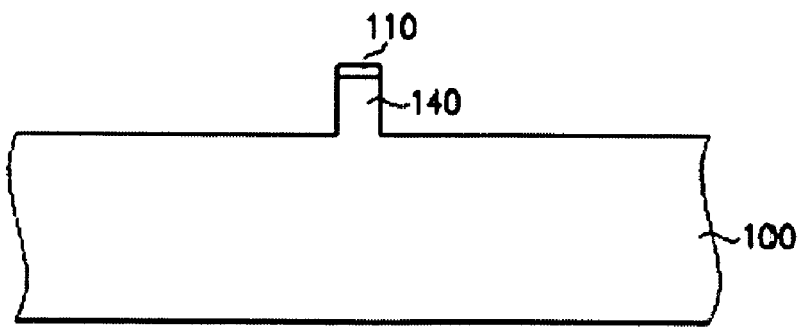

As shown in FIG. 2E, the pad oxide film 110 and the silicon substrate 100 are removed as much as the predetermined thickness using the spacer 135 as a mask, thereby forming a silicon pattern 140. It is preferable that the silicon pattern is formed to have a thickness within the range of 500 Å to 2000 Å. Thereafter, the pad oxide film 110 which is formed on the silicon pattern 140 is removed.

Figure 2F:
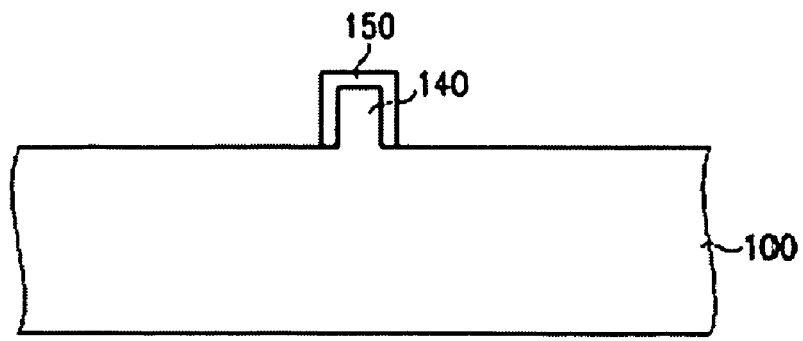

As shown is FIG. 2F, a nitride film (not shown) is deposited on the substrate 100 including the silicon pattern 140 and is etched back, thereby forming a barrier film 150 which buries the upper surface and the side surface of the silicon pattern 140. It is preferable that the barrier film 150 is formed to have a thickness within the range of 200 Å to 500 Å.

Figure 2G:
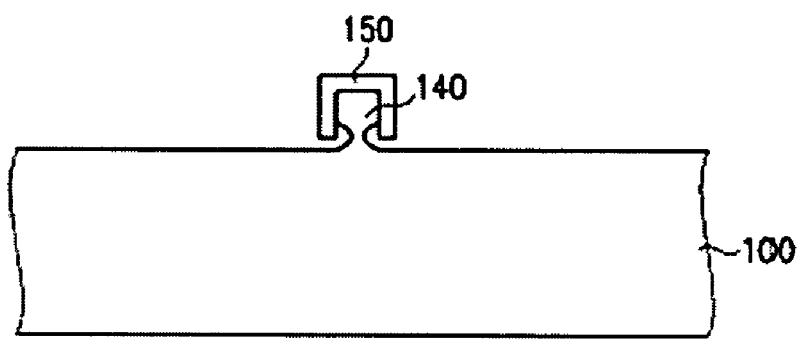

As shown in FIG. 2G, isotropic etching is applied to the substrate 100 at which the barrier film 150 is formed, using the barrier film 150 as a mask, thereby partially etching the substrate 100 as much as the predetermined thickness at the same time when the lower end of the silicon pattern 140 buried with the barrier film 150 is partially etched.

Figure 2H:
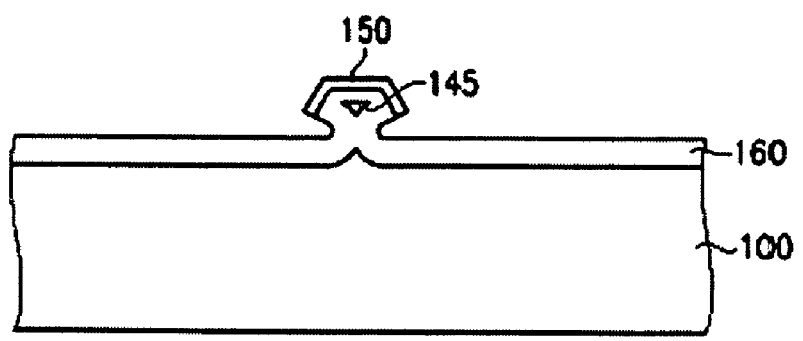

As shown in FIG. 2H, the exposed silicon substrate 100 is oxidized by the thermal oxidation process. Then, a part of the barrier film 150 that buries the side surface of the silicon pattern 140 is expanded into both sides by thermal expansion, and silicon (Si) on the surface of the silicon substrate 100 and a part of silicon of the silicon pattern 140 are oxidized by the Si—$O_2$ bond, thereby forming a gate oxide film 160. The gate oxide film 160 is formed to have a thickness within the range of 50 Å to 200 Å, more preferably 100 Å.

While the gate oxide film 160 is formed by the thermal oxidation process, the silicon pattern is not totally oxidized by the barrier film 150 which is formed at the upper surface and the side surface of the silicon pattern 140 and, a part of the several tens of nano sized silicon pattern remains in the gate oxide film 160, thereby forming a silicon quantum dot 145.

Figure 2I:
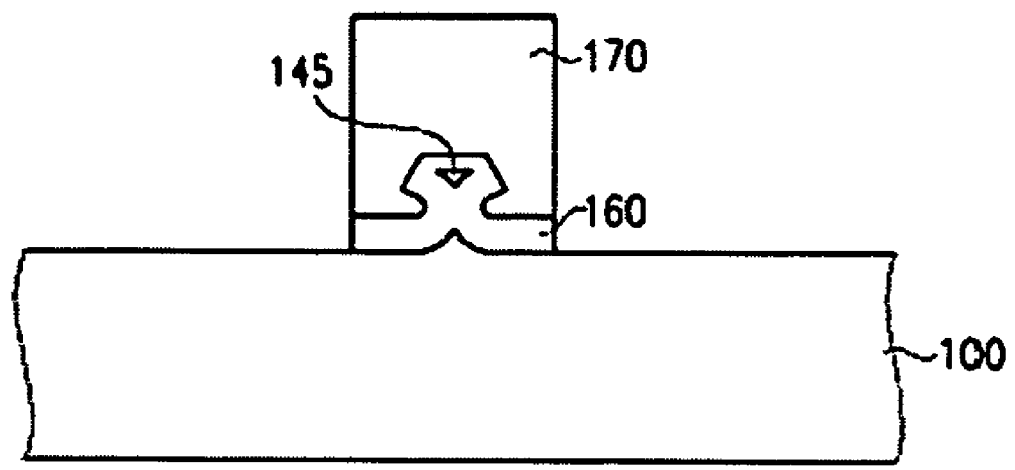

As shown in FIG. 2I, the barrier film is removed, and a conductive layer for an electrode (not shown) such as polysilicon is formed on the gate oxide film 160 and is then selectively etched, thereby forming a control gate 170. In one example, the control gate 170 is formed to have the thickness within the range of 1000 Å to 2500 Å, but it can be formed differently according to its use.

As shown in FIG. 1, conductive impurity ions are implanted to the substrate 100 using the control gate as a mask, thereby forming source/drain regions 180.

As described in the above, a nano-sized silicon quantum dot having delicate and uniform characteristics may be produced. Also, the size of the silicon quantum dot according to a process characteristic may be easily adjusted.

Methods of forming silicon quantum dots are disclosed above. One example method includes sequentially forming a pad oxide film and a sacrificial insulation film on a silicon substrate; forming a wall layer by selectively etching the sacrificial insulation film; forming a spacer at the side wall of the wall layer; etching the silicon substrate as much as a predetermined thickness using the spacer as a mask, thereby forming a silicon pattern; forming a barrier film for burying the upper surface and the side surface of the silicon pattern; applying isotropic etching to the substrate using the barrier film as a mask; and oxidizing the isotropic etched substrate with thermal treatment, thereby forming a gate oxide film.

In one example, the sacrificial insulation film is formed with a nitride film. Such a sacrificial insulation film may be formed to have a thickness within the range of 1000 Å to 2000 Å. Forming the spacer at the side wall of a wall layer may include depositing a oxide film as much as a predetermined thickness at the front surface of the substrate which has a wall layer; and etching back the oxide film. The oxide film may be formed to have a thickness within the range of 500 Å to 2000 Å. The silicon pattern may be formed to have a thickness within the range of 500 Å to 2000 Å. The gate oxide film may be formed to have a thickness within the range of 50 Å to 200 Å. The barrier film may be formed to have a thickness within the range of 200 Å to 500 Å.

An example method of fabricating a semiconductor memory device may include sequentially forming a pad oxide film and a sacrificial insulation film on a silicon substrate; forming a wall layer by selectively etching the sacrificial insulation film; forming a spacer at the side wall of the wall layer; etching the silicon substrate as much as a predetermined thickness using the spacer as a mask, thereby forming a silicon pattern; forming a barrier film for burying the upper surface and the side surface of the silicon pattern; applying isotropic etching to the substrate using the barrier film as a mask; oxidizing the isotropic etched substrate with thermal treatment, thereby forming a gate oxide film; forming a conductive layer for an electrode on the gate oxide film; and removing selectively the conductive layer for an electrode and the gate oxide film.

In such an arrangement, the conductive layer for an electrode may be formed to have a thickness within the range of 1000 Å to 2500 Å, using polysilicon.

This patent application makes reference to, incorporates the same herein, and claims all benefits accruing under 35 U.S.C. §119 from an application for Method for Forming Silicon Quantum Dot and Method for Fabricating Semiconductor Memory Device using the Same, filed in the Korean Industrial Property Office on Dec. 31, 2003 and there duly assigned Ser. No. 10-2003-0101926.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming a silicon quantum dot comprising:
sequentially forming a pad oxide film and a sacrificial insulation film on a silicon substrate;
forming a wall layer by selectively etching the sacrificial insulation film;
forming a spacer at the side wall of the wall layer;
forming a silicon pattern by etching the silicon substrate as much as a predetermined thickness using the spacer as a mask;
forming a barrier film for burying the upper surface and the side surface of the silicon pattern;
applying an isotropic etching to the substrate using the barrier film as a mask; and
oxidizing the isotropic etched substrate with thermal treatment, thereby forming a gate oxide film.

2. The method for forming a silicon quantum dot of claim 1, wherein the sacrificial insulation film is formed with a nitride film.

3. The method for forming a silicon quantum dot of claim 1, wherein the sacrificial insulation film is formed to have a thickness within the range of 1000 Å to 2000 Å.

4. The method for forming a silicon quantum dot of claim 1, wherein forming a spacer at the side wall of the wall layer comprises: depositing an oxide film as much as a predetermined thickness at the front surface of the substrate which has the wall layer; and etching back the oxide film.

5. The method for forming a silicon quantum dot of claim 4, wherein the oxide film is formed to have a thickness within the range of 500 Å to 2000 Å.

6. The method for forming a silicon quantum dot of claim 1, wherein the silicon pattern is formed to have a thickness within the range of 500 Å to 2000 Å.

7. The method for forming a silicon quantum dot of claim 1, wherein the gate oxide film is formed to have a thickness within the range of 50 Å to 200 Å.

8. The method for forming a silicon quantum dot of claim 1, the barrier film is formed to have a thickness within the range of 200 Å to 500 Å.

9. A method of fabricating a semiconductor memory device comprising:

sequentially forming a pad oxide film and a sacrificial insulation film on a silicon substrate;

forming a wall layer by selectively etching the sacrificial insulation film;

forming a spacer at the side wall of the wall layer;

forming a silicon pattern by etching the silicon substrate as much as a predetermined thickness using the spacer as a mask;

forming a barrier film for burying the upper surface and the side surface of the silicon pattern;

applying an isotropic etching to the substrate using the barrier film as a mask;

oxidizing the isotropic etched substrate with thermal treatment, thereby forming a gate oxide film;

forming a conductive layer for an electrode on the gate oxide film; and removing selectively the conductive layer for an electrode and the gate oxide film.

10. The method for fabricating a semiconductor memory device of claim 9, wherein the conductive layer for an electrode is formed to have a thickness within the range of 1000 Å to 2500 Å, using polysilicon.

* * * * *